United States Patent
Uemura et al.

(10) Patent No.: US 11,343,918 B2
(45) Date of Patent: May 24, 2022

(54) METHOD OF MAKING PRINTED CIRCUIT BOARD AND LAMINATED STRUCTURE

(71) Applicant: SUMITOMO ELECTRIC INDUSTRIES, LTD., Osaka (JP)

(72) Inventors: Shigeaki Uemura, Osaka (JP); Eiko Imazaki, Osaka (JP); Koji Nitta, Osaka (JP); Yoshio Oka, Osaka (JP); Hideki Matsuoka, Osaka (JP); Ippei Tanaka, Osaka (JP); Takayuki Yonezawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/633,271

(22) PCT Filed: Dec. 17, 2018

(86) PCT No.: PCT/JP2018/046337
§ 371 (c)(1),
(2) Date: Jan. 23, 2020

(87) PCT Pub. No.: WO2019/124307
PCT Pub. Date: Jun. 27, 2019

(65) Prior Publication Data
US 2021/0045250 A1     Feb. 11, 2021

(30) Foreign Application Priority Data

Dec. 20, 2017   (JP) .............................. JP2017-244121

(51) Int. Cl.
H05K 1/00     (2006.01)
H05K 1/02     (2006.01)
(Continued)

(52) U.S. Cl.
CPC ........... *H05K 3/0023* (2013.01); *H05K 3/108* (2013.01); *H05K 3/4655* (2013.01)

(58) Field of Classification Search
CPC .. H05K 1/00; H05K 1/02; H05K 1/03; H05K 1/11; H05K 1/16; H05K 3/00; H05K 3/02;
(Continued)

(56) References Cited

U.S. PATENT DOCUMENTS 4,211,560 A * 7/1980 Taguchi .................... G03F 7/26
                                                    430/313
4,430,416 A * 2/1984 Goto ......................... B24C 1/04
                                                    216/48
(Continued)

FOREIGN PATENT DOCUMENTS

JP    S61-095344    5/1986
JP    H06-053642    2/1994
(Continued)

OTHER PUBLICATIONS

"Dry Film—Introduction of Mechanism" [online], Retrieved from the Internet: <URL: http://www.nikko-materials.com/dry_mechanism>, with partial English translation.

*Primary Examiner* — Xiaoliang Chen
(74) *Attorney, Agent, or Firm* — IPUSA, PLLC

(57) ABSTRACT

A method of making a printed circuit board includes a step of providing a double-sided plate that is an insulating substrate having conductive layers on respective surfaces thereof, a first coating step of coating a first surface of the double-sided plate with a first photosensitive resin film, a second coating step of coating a second surface of the double-sided plate with a second photosensitive resin film, a first exposure step of exposing the photosensitive resin film coating the first surface after the first and second coating steps, and a second exposure step of exposing the photo-
(Continued)

sensitive resin film coating the second surface after the first exposure step, wherein a maximum depth of a depression in an outermost surface of the second photosensitive resin film used in the second exposure step is less than 1.0 µm.

3 Claims, 2 Drawing Sheets

(51) Int. Cl.
| | |
|---|---|
| H05K 1/03 | (2006.01) |
| H05K 1/11 | (2006.01) |
| H05K 1/16 | (2006.01) |
| H05K 3/00 | (2006.01) |
| H05K 3/02 | (2006.01) |
| H05K 3/06 | (2006.01) |
| H05K 3/10 | (2006.01) |
| H05K 3/18 | (2006.01) |
| H05K 3/22 | (2006.01) |
| H05K 3/38 | (2006.01) |
| H05K 3/46 | (2006.01) |
| B24C 1/00 | (2006.01) |
| B24C 1/04 | (2006.01) |
| B24C 3/00 | (2006.01) |
| B24C 3/32 | (2006.01) |
| G06F 3/044 | (2006.01) |
| G03F 7/00 | (2006.01) |
| G03F 7/004 | (2006.01) |
| G03F 7/027 | (2006.01) |
| G03F 7/031 | (2006.01) |
| G03F 7/033 | (2006.01) |
| G03F 7/039 | (2006.01) |
| G03F 7/085 | (2006.01) |
| G03F 7/12 | (2006.01) |

(58) Field of Classification Search
CPC .......... H05K 3/0023; H05K 3/06; H05K 3/10; H05K 3/18; H05K 3/22; H05K 3/38; H05K 3/46; H05K 3/107; H05K 3/4655; B24C 1/00; B24C 1/04; B24C 3/00; B24C 3/32
USPC ....... 174/255, 250, 254, 256, 260, 261, 262; 216/13, 16, 17, 18, 20, 48, 52; 428/172, 428/213, 215, 332, 336, 337; 522/15; 430/5, 172, 270.1, 271.1, 273.1, 281.1, 430/284.1, 285.1, 286.1, 287.1, 311, 313, 430/319, 325, 905, 910, 911
See application file for complete search history.

(56) References Cited

U.S. PATENT DOCUMENTS

| | | | | | |
|---|---|---|---|---|---|
| 4,438,190 | A | * | 3/1984 | Ishimaru | B23K 35/224 430/281.1 |
| 4,499,163 | A | * | 2/1985 | Ishimaru | C08F 2/50 430/284.1 |
| 4,544,625 | A | * | 10/1985 | Ishimaru | B23K 35/224 430/270.1 |
| 4,961,817 | A | * | 10/1990 | Seki | B26F 3/00 156/719 |
| 5,135,606 | A | * | 8/1992 | Kato | H01L 21/486 205/135 |
| 5,258,094 | A | * | 11/1993 | Furui | H05K 3/4614 216/18 |
| 5,462,805 | A | * | 10/1995 | Sakamoto | B32B 17/10761 428/430 |
| 5,601,905 | A | * | 2/1997 | Watanabe | G03F 7/094 428/213 |
| 5,756,261 | A | * | 5/1998 | Takehana | B24C 1/04 430/284.1 |
| 5,776,995 | A | * | 7/1998 | Obiya | B24C 1/04 430/284.1 |
| 5,837,427 | A | * | 11/1998 | Hwang | H01L 21/4857 430/312 |
| 5,916,738 | A | * | 6/1999 | Takehana | B24C 1/04 430/323 |
| 5,924,912 | A | * | 7/1999 | Takehana | G03F 7/12 451/29 |
| 5,986,335 | A | * | 11/1999 | Amagai | H01L 23/4951 257/666 |
| 6,169,593 | B1 | * | 1/2001 | Kanaya | G02F 1/13458 349/187 |
| 6,225,570 | B1 | * | 5/2001 | Ishiyama | H05K 1/162 174/260 |
| 2001/0012869 | A1 | * | 8/2001 | Fukushima | G03F 7/0757 524/588 |
| 2001/0023532 | A1 | * | 9/2001 | Fujii | H01L 21/6835 29/830 |
| 2002/0055062 | A1 | * | 5/2002 | Hayashi | G03F 7/0387 430/270.1 |
| 2002/0146582 | A1 | * | 10/2002 | Tsutsumi | B32B 27/32 428/523 |
| 2004/0018446 | A1 | * | 1/2004 | Aoki | G03F 7/028 430/271.1 |
| 2004/0023120 | A1 | * | 2/2004 | Nishikubo | H05K 3/285 429/253 |
| 2004/0048978 | A1 | * | 3/2004 | Okada | C08F 283/04 524/606 |
| 2004/0063025 | A1 | * | 4/2004 | Natori | G03F 7/031 430/270.1 |
| 2004/0079664 | A1 | * | 4/2004 | Watanabe | G03C 3/00 206/410 |
| 2004/0146263 | A1 | * | 7/2004 | Mune | G02B 6/132 385/129 |
| 2004/0221447 | A1 | * | 11/2004 | Ishii | H05K 1/0259 29/830 |
| 2004/0265731 | A1 | * | 12/2004 | Okada | G03F 7/037 430/270.1 |
| 2005/0118750 | A1 | * | 6/2005 | Baba | H05K 3/4069 438/128 |
| 2005/0153238 | A1 | * | 7/2005 | Honda | G03F 7/0233 430/270.1 |
| 2005/0186332 | A1 | * | 8/2005 | Funada | G11B 5/486 427/96.1 |
| 2005/0238998 | A1 | * | 10/2005 | Nakazato | G03F 7/027 430/281.1 |
| 2007/0105036 | A1 | * | 5/2007 | Kumaki | G03F 7/031 430/270.1 |
| 2007/0111136 | A1 | * | 5/2007 | Miyasaka | G03F 7/42 430/270.1 |
| 2007/0126030 | A1 | * | 6/2007 | Ito | H01L 24/11 257/211 |
| 2007/0172756 | A1 | * | 7/2007 | Ishikawa | G03F 7/027 430/270.1 |
| 2007/0212642 | A1 | * | 9/2007 | Sugiyama | C07F 17/00 430/270.1 |
| 2007/0227193 | A1 | * | 10/2007 | Shimizu | G02B 1/045 65/386 |
| 2007/0264601 | A1 | * | 11/2007 | Uematsu | G03F 7/033 430/496 |
| 2007/0269738 | A1 | * | 11/2007 | Itagaki | G03F 7/0955 430/270.1 |
| 2007/0292804 | A1 | * | 12/2007 | Uematsu | G03F 7/031 430/286.1 |
| 2007/0295534 | A1 | * | 12/2007 | Ishii | G11B 5/486 174/261 |
| 2008/0000673 | A1 | * | 1/2008 | Ishii | G11B 5/486 174/250 |
| 2008/0029293 | A1 | * | 2/2008 | Ooyabu | H05K 1/0259 174/250 |
| 2008/0088813 | A1 | * | 4/2008 | Takashima | G03F 7/001 355/67 |
| 2008/0113302 | A1 | * | 5/2008 | Takashima | G03F 7/70291 430/322 |

(56) References Cited

U.S. PATENT DOCUMENTS

| | | | |
|---|---|---|---|
| 2008/0213688 A1* | 9/2008 | Iwasaki | G03F 7/091 430/270.1 |
| 2008/0268374 A1* | 10/2008 | Tashiro | G03F 7/0045 430/280.1 |
| 2008/0278858 A1* | 11/2008 | Ishii | H05K 1/0278 360/245.9 |
| 2009/0062421 A1* | 3/2009 | Makino | C08G 59/182 522/134 |
| 2009/0166818 A1* | 7/2009 | Banba | H01L 23/3192 257/642 |
| 2009/0202944 A1* | 8/2009 | Miyasaka | H01J 9/242 430/286.1 |
| 2009/0274900 A1* | 11/2009 | Kim | G03F 7/0226 428/336 |
| 2009/0296364 A1* | 12/2009 | Yamamoto | H01L 21/6835 361/820 |
| 2009/0297981 A1* | 12/2009 | Itagaki | G03F 7/031 430/286.1 |
| 2009/0297982 A1* | 12/2009 | Saitou | G03F 7/031 430/286.1 |
| 2009/0310908 A1* | 12/2009 | Kanagawa | G11B 5/4866 385/14 |
| 2009/0310909 A1* | 12/2009 | Ishii | G11B 5/486 385/14 |
| 2009/0314525 A1* | 12/2009 | Kajino | H05K 3/4682 174/255 |
| 2009/0317746 A1* | 12/2009 | Ajioka | G03F 7/027 430/287.1 |
| 2010/0040339 A1* | 2/2010 | Makino | G02B 6/1221 385/141 |
| 2010/0112474 A1* | 5/2010 | Iwasaki | G03F 7/105 430/270.1 |
| 2010/0129752 A1* | 5/2010 | Ajioka | G03F 7/027 430/271.1 |
| 2010/0239977 A1* | 9/2010 | Banba | G03F 7/40 430/270.1 |
| 2010/0248162 A1* | 9/2010 | Watanabe | G03F 7/085 430/325 |
| 2011/0033161 A1* | 2/2011 | Ochiai | G02B 1/048 385/124 |
| 2011/0033614 A1* | 2/2011 | Nakashiba | G02B 6/138 427/163.2 |
| 2011/0081616 A1* | 4/2011 | Ajioka | C08F 2/50 430/319 |
| 2011/0086309 A1* | 4/2011 | Nankawa | C08F 212/08 430/270.1 |
| 2011/0111344 A1* | 5/2011 | Ajioka | G03F 7/027 430/281.1 |
| 2011/0135891 A1* | 6/2011 | Moon | G03F 7/11 428/195.1 |
| 2011/0159430 A1* | 6/2011 | Miyasaka | C08F 212/08 430/270.1 |
| 2012/0015288 A1* | 1/2012 | Ikeda | G03F 7/202 430/5 |
| 2012/0040290 A1* | 2/2012 | Ajioka | G03F 7/031 430/286.1 |
| 2012/0048594 A1* | 3/2012 | Tomizawa | G03F 7/0388 174/250 |
| 2012/0067626 A1* | 3/2012 | Mizutani | H05K 3/287 174/255 |
| 2012/0282549 A1* | 11/2012 | Tomizawa | G03F 7/035 430/284.1 |
| 2012/0301824 A1* | 11/2012 | Yoshida | G03F 7/004 430/270.1 |
| 2012/0301825 A1* | 11/2012 | Yoshida | G03F 7/095 430/270.1 |
| 2013/0076458 A1* | 3/2013 | Katou | G03F 7/40 333/195 |
| 2013/0183027 A1 | 7/2013 | Lee et al. | |
| 2013/0223803 A1* | 8/2013 | Yamaguchi | G02B 6/1221 385/123 |
| 2013/0298398 A1* | 11/2013 | Miyasaka | H05K 3/10 29/846 |
| 2014/0158412 A1* | 6/2014 | Kido | C08L 63/00 174/254 |
| 2014/0178814 A1* | 6/2014 | Yoon | G03F 7/11 430/273.1 |
| 2015/0101857 A1* | 4/2015 | Kim | H05K 3/4682 174/262 |
| 2015/0126029 A1* | 5/2015 | Kimura | G03F 7/11 438/670 |
| 2015/0153647 A1* | 6/2015 | Itagaki | G03F 7/085 430/285.1 |
| 2015/0169111 A1* | 6/2015 | Hashimoto | G06F 3/0445 345/174 |
| 2015/0185603 A1* | 7/2015 | Yoshida | H05K 3/285 430/270.1 |
| 2015/0293443 A1* | 10/2015 | Okade | H05K 3/0017 430/285.1 |
| 2015/0382473 A1* | 12/2015 | Okamoto | G03F 7/0385 174/250 |
| 2016/0017105 A1* | 1/2016 | Wu | B32B 27/281 156/60 |
| 2016/0077434 A1* | 3/2016 | Sasahara | B32B 37/003 428/195.1 |
| 2016/0131974 A1* | 5/2016 | Abe | G03F 7/027 428/172 |
| 2016/0170096 A1* | 6/2016 | Sakai | B32B 15/08 359/642 |
| 2016/0170299 A1* | 6/2016 | Kume | G03F 7/033 216/13 |
| 2016/0209743 A1* | 7/2016 | Uchigasaki | G03F 7/40 |
| 2016/0246174 A1* | 8/2016 | Iwashita | G03F 7/027 |
| 2016/0280829 A1* | 9/2016 | Uchigasaki | C08F 265/06 |
| 2016/0291471 A1* | 10/2016 | Li | B32B 7/12 |
| 2016/0322293 A1* | 11/2016 | Kimura | H05K 3/3452 |
| 2016/0330845 A1* | 11/2016 | Okade | C25D 7/12 |
| 2017/0045817 A1* | 2/2017 | Nagoshi | G03F 7/027 |
| 2017/0139325 A1* | 5/2017 | Sato | G03F 7/168 |
| 2017/0153551 A1* | 6/2017 | Kume | G03F 7/028 |
| 2017/0164473 A1* | 6/2017 | Denda | H01L 23/5384 |
| 2017/0219923 A1* | 8/2017 | Oota | B32B 27/00 |
| 2017/0261851 A1* | 9/2017 | Okade | G03F 7/029 |
| 2018/0002567 A1* | 1/2018 | Huang | C08J 5/18 |
| 2018/0074405 A1* | 3/2018 | Sato | G03F 7/2002 |
| 2018/0107112 A1* | 4/2018 | Sato | G03F 7/20 |
| 2018/0237549 A1* | 8/2018 | Takeuchi | B32B 27/281 |
| 2018/0282577 A1* | 10/2018 | Cheng | C08G 73/1067 |
| 2018/0284920 A1* | 10/2018 | Watanabe | B32B 27/286 |

FOREIGN PATENT DOCUMENTS

| | | |
|---|---|---|
| JP | 2011-249514 | 12/2011 |
| JP | 2013-505483 | 2/2013 |

* cited by examiner

METHOD OF MAKING PRINTED CIRCUIT BOARD AND LAMINATED STRUCTURE

TECHNICAL FIELD

The disclosures herein relate to a method of making a printed circuit board having conductor patterns on which electronic components are mounted, and relate to a laminated structure for use in the method of making a printed circuit board. The present application claims priority to Japanese patent application No. 2017-244121 filed on Dec. 20, 2017, and the entire contents of this Japanese patent application are hereby incorporated by reference.

BACKGROUND ART

An example of the method of forming a conductor pattern on a printed circuit board, e.g., a flexible printed circuit board (FPC), which has a conductor pattern on a surface of an insulating substrate for mounting microelectronic components such as semiconductor devices, includes a widely used method of forming a conductor pattern through exposure to light by using a photosensitive resin film (dry film, resist film) having a photosensitive resin layer (resist layer) on a conductive layer laminated on the surface of an insulating substrate.

For example, a method (subtractive method) of forming interconnect traces on an insulating substrate known in the art coats a conductive layer made of copper or the like, laminated on the insulating substrate made of a polyimide film or the like, with a photosensitive resin film, and exposes a desired interconnect pattern to light through a mask (photomask) having a tracing of the interconnect pattern to cause the portions corresponding to the interconnect pattern to react with light, followed by developing and etching the conductive layer by leaving only the portions of the interconnects of the conductive layer (Non-Patent Document 1, for example).

Further, a method (semi-additive method) disclosed in Patent Document 1 forms a conductive layer (seed layer) having a thickness of about 1 µm on an insulating resin layer (i.e., on the surface of an insulating substrate) by electroless copper plating, and forms a photosensitive resin layer on the surface thereof, followed by exposing a desired interconnect pattern to light through a mask to develop and to form a photosensitive resin layer pattern through which the electroless copper plating layer is partially exposed. Thereafter, electric power is supplied to the electroless copper plating layer to perform electrolytic copper plating with respect to the exposed portions of the electroless copper plating layer to form a conductor pattern.

Photosensitive resin films used in the subtractive method and the semi-additive method described above are comprised of a photosensitive resin layer and a support layer laminated on the surface thereof, and are often shipped with a protective layer laminated on the opposite surface of the photosensitive resin layer. In the case of manufacturing a printed circuit board having conductor patterns on both surfaces thereof, both surfaces of an insulating substrate having laminated conductive layers thereon or of an insulating substrate having seed layers thereon are coated with photosensitive resin films such that the photosensitive resin layers are in contact with the conductive layers or the seed layers. One of the surfaces is exposed to light through a mask, and, subsequently, the other surface is also exposed to light through a mask.

RELATED-ART DOCUMENTS

Patent Document

[Patent Document 1] Japanese Patent Application Publication No. 2011-249514

Non-Patent Document

[Non-Patent Document 1] <http://www.nikko-materials.com/dry_mechanism> Dry Film Introduction of Mechanism, Nikko-Materials Co., Ltd.

SUMMARY OF THE INVENTION

A first aspect of the present disclosures is:

a method of making a printed circuit board having conductor patterns on both surfaces of an insulating substrate, including:

a step of providing a double-sided plate that is an insulating substrate having conductive layers on respective surfaces thereof;

a first coating step of coating a first surface of the double-sided plate with a first photosensitive resin film having a photosensitive resin layer and a support layer such that the photosensitive resin layer and the conductive layer come in contact with each other;

a second coating step of coating a second surface of the double-sided plate with a second photosensitive resin film having a photosensitive resin layer and a support layer such that the photosensitive resin layer and the conductive layer come in contact with each other;

a first exposure step of exposing the photosensitive resin film coating the first surface after the first and second coating steps; and a second exposure step of exposing the photosensitive resin film coating the second surface after the first exposure step, wherein a maximum depth of a depression in an outermost surface of the second photosensitive resin film used in the second exposure step is less than 1.0 µm.

A second aspect of the present disclosures is:

a method of making a printed circuit board having conductor patterns on both surfaces of an insulating substrate, including:

a step of providing a double-sided plate including the insulating substrate, a conductive layer A1 laminated on one surface thereof, and a conductive layer B1 laminated on another surface of the insulating substrate;

a first coating step of coating a surface of the conductive layer A1 with a photosensitive resin film C1 having a photosensitive resin layer and a support layer covering one surface thereof such that the photosensitive resin layer is in contact with the conductive layer A1;

a second coating step of coating a surface of the conductive layer B1 with a laminated structure including a photosensitive resin film D1 and a cover layer, the photosensitive resin film D1 including a photosensitive resin layer and a support layer covering one surface thereof, the cover layer covering a surface of the support layer, such that the photosensitive resin layer is in contact with the conductive layer B1;

a first exposure step of exposing the photosensitive resin film C1 after the second coating step;

a cover layer detachment step of detaching the cover layer after the first exposure step; and a second exposure step of exposing the photosensitive resin film D1 after the cover layer detachment step.

A third aspect of the present disclosures is:

a method of making a printed circuit board having conductor patterns on both surfaces of an insulating substrate, including:

a step of providing a double-sided plate including the insulating substrate, a conductive layer A1 laminated on one surface thereof, and a conductive layer B1 laminated on another surface of the insulating substrate;

a first coating step of coating a surface of the conductive layer A1 with a photosensitive resin film C1 having a photosensitive resin layer and a support layer covering one surface thereof such that the photosensitive resin layer is in contact with the conductive layer A1;

a second coating step of coating a surface of the conductive layer B1 with a photosensitive resin film D1 having a photosensitive resin layer and a support layer covering one surface thereof such that the photosensitive resin layer is in contact with the conductive layer B1;

a third coating step of coating a surface of the support layer constituting the photosensitive resin film D1 with a cover layer after the second coating step;

a first exposure step of exposing the photosensitive resin film C1 after the third coating step;

a cover layer detachment step of detaching the cover layer after the first exposure step; and a second exposure step of exposing the photosensitive resin film D1 after the cover layer detachment step.

A fourth aspect of the present disclosures is:

a laminated structure used in a method of making a printed circuit board, which includes a photosensitive resin layer, a support layer covering one surface of the photosensitive resin layer, and a cover layer covering a surface of the support layer.

MODE FOR CARRYING OUT THE INVENTION

Figure 1:
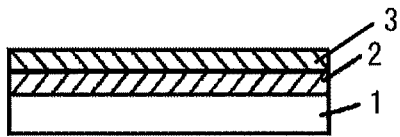
FIG. 1 is a cross-sectional view schematically illustrating the configuration of one embodiment of a laminated structure of the fourth aspect of the present disclosures.

[Problem to be Solved by the Present Disclosure]

In the case in which conductor patterns are formed on both surfaces by exposing one of the surfaces to light and thereafter exposing the other surface to light as described in Patent Document 1, the other surface is likely to suffer the occurrence of a break (i.e., defect) in the formed conductor patter in the subtractive method, and is likely to suffer the occurrence of a short defect in the formed conductor pattern in the semi-additive method. There is thus a problem that the conductor patterns are not formed with highly precise shapes and dimensions.

This problem is especially significant when conductor patterns are formed with a fine pitch such that L/S (line/space) is equal to 50/50 μm or less.

The present disclosures are based on the above-noted problems, and are directed to providing a method of making a printed circuit board having conductor patterns on both surfaces thereof, in which, even in the case of exposing a desired conductor pattern to light on one of the surfaces first and thereafter exposing a desired conductor pattern to light on the other surface, the other surface is less likely to suffer the occurrence of an interconnect break in the subtractive method and the occurrence of a short defect in the semi-additive method, thereby enabling the making of conductor patterns with highly precise shapes and dimensions.

The present disclosures are also directed to providing a laminated structure for use in the method of making a printed circuit board.

Through analysis, the inventors have found that using a photosensitive resin film having a depression with a maximum depth of several micrometers or more on the surface of a support layer causes a defect such as a thread-like scratch in the photosensitive resin layer after development, and such a scratch (defect) will result in a failure such as a break in conductor patterns in the subtractive method and a short defect in conductor patterns in the semi-additive method.

The inventors have also found that the probability of occurrence of such a failure tends to increase as the maximum depth of a depression in the surface of a support layer deepens.

The inventors have further found that when the maximum depth of a depression present in the surface of a support layer is less than 1 μm, the probability of occurrence of such a failure becomes significantly low, resulting in the reduced likelihood of occurrence of a failure such as a break or short defect in conductor patterns.

The inventors have also found that, when performing a series of processes up to an exposure process on one surface of an insulating substrate, the surface of the support layer of a photosensitive resin film that covers the other surface of the insulating substrate comes in contact with a roller or the like for carrying the object to be exposed to light, thereby receiving a damage such as a depression having a maximum depth of 1 μm or more. This damage causes the failure as previously described.

The inventors have also found that placing a laminated structure having films for protection on the surface of the support layer, which comes in contact with a roller or the like, or laminating films for protection on the surface of the support layer, serves to prevent the occurrence of a depression having a maximum depth of 1 μm or more despite the presence of a roller or the like coming in contact with the surface of the support layer. The inventors have completed the present disclosures upon finding that such an arrangement results in the reduction of occurrence of the previously-noted failure, i.e., a break or short defect in conductor patterns.

[Advantage of the Present Disclosure]

According to a first aspect, a method of making a printed circuit board having conductor patterns on both surfaces thereof is provided, in which, even in the case of exposing a desired conductor pattern to light on one of the surfaces first and thereafter exposing a desired conductor pattern to light on the other surface, the other surface is less likely to suffer the occurrence of a break or short defect in the conductor pattern. The method thus enables the making of conductor patterns with highly precise shapes and dimensions.

According to a second aspect and a third aspect, a method of making a printed circuit board having conductor patterns on both surfaces thereof is provided, in which, even in the case of exposing a desired conductor pattern to light on one of the surfaces first and thereafter exposing a desired conductor pattern to light on the other surface, the other surface is free from the occurrence of a depression having a maximum depth of 1 μm or more despite coming in contact with a roller or the like for carrying the object to be exposed during a series of processes up to the exposure process performed on the one of the surfaces. As a result, the occurrence of a break or short defect in the conductor pattern is reduced, thereby providing a method of making a printed circuit board that enables the making of conductor patterns with highly precise shapes and dimensions.

According to a fourth aspect, a laminated structure for use in the second aspect is provided.

[Description of Embodiments of the Present Disclosures]

In the following, embodiments for implementing the present disclosures will be described. It may be noted that the present disclosures are not limited to the embodiments described in the following, but include all the modifications within the scope of the claims and within the spirits and scope of equivalents corresponding to the claims.

(1) First Aspect

The first aspect of the present disclosures is:

a method of making a printed circuit board having conductor patterns on both surfaces of an insulating substrate, including:

a step of providing a double-sided plate that is an insulating substrate having conductive layers on respective surfaces thereof;

a first coating step of coating a first surface of the double-sided plate with a first photosensitive resin film having a photosensitive resin layer and a support layer such that the photosensitive resin layer and the conductive layer come in contact with each other;

a second coating step of coating a second surface of the double-sided plate with a second photosensitive resin film having a photosensitive resin layer and a support layer such that the photosensitive resin layer and the conductive layer come in contact with each other;

a first exposure step of exposing the photosensitive resin film coating the first surface after the first and second coating steps; and a second exposure step of exposing the photosensitive resin film coating the second surface after the first exposure step, wherein a maximum depth of a depression in an outermost surface of the second photosensitive resin film used in the second exposure step is less than 1.0 μm.

The method of making a printed circuit board according to the present aspect is characterized in that the maximum depth of a depression in the surface of the support layer of the second photosensitive resin film used in this method is less than 1.0 μm.

When forming a conductor pattern with a fine pitch such that L/S is equal to 50/50 μm or less, a failure such as a break (in the case of a subtractive method) or a short defect (in the case of a semi-additive method) in the conductor pattern is likely to occur.

The inventors have found that the presence of defects such as irregularities on the surface of the support layer of the photosensitive resin film, especially the presence of a depression having a maximum depth of 1 μm or more, causes light to be scattered due to the irregularities, which in turn causes the photosensitive resin layer underneath the irregularities to be not sufficiently exposed to light. Defective light exposure thus occurs during the exposure process, resulting in the occurrence of a thread-like scratch in the interconnect pattern made of the photosensitive resin after development. The previously-noted failure occurs due to this thread-like scratch. The inventors have found that when the maximum depth of a depression in the surface of the support layer of the photosensitive resin film is less than 1 μm, a defect such as a break (in the case of a subtractive method) and a short defect (in the case of a semi-additive method) in the conductor pattern is less likely to occur, and almost never occurs.

The support layer is typically a film made of a resin that transmits ultraviolet light. In the exposure process during the manufacturing of a printed circuit board, the support layer may come in contact with equipment such as a roller, thereby ending up having irregularities on the surface thereof. Reducing the occurrence of such irregularities and reducing the depth of a depression in the surface of the support layer serves to decrease the occurrence of the previously-noted failures. Especially, reducing the maximum depth of the depression to be less than 1 μm makes it less likely for the previously-noted failures to occur.

The occurrence of the previously-noted failure is also reduced by reducing the length of a depression in the surface of the support layer of the second photosensitive resin film. In particular, it is preferable to have the condition that the maximum depth of a depression in the surface of the support layer of the second photosensitive resin film is less than 1 μm, and that the maximum length of a depression is less than 5.0 μm. This is because the occurrence of a failure in the conductor pattern such as a break (in the case of a subtractive method) or a short defect (in the case of a semi-additive method) is more reliably reduced.

In the following, the configuration of a production method according to the present aspect will be described.

<Printed Circuit Board>

A printed circuit board is a substrate configured such that the interconnects of an electrical circuit are printed on the surface of, or in the inside of, a board or film (i.e., insulating substrate) made of an insulating material. The printed circuit board made in accordance with the present aspect is one which has conductor patterns on the respective opposite surfaces of an insulating substrate. Such a printed circuit board includes a printed circuit board with interconnects formed by a subtractive method and a printed circuit board with interconnects formed by a semi-additive method. Examples of printed circuit boards made in accordance with the present aspect include a flexible printed circuit board.

As an insulating substrate, a polyimide (PI) film is preferably used because of the excellent heat resistance thereof. Alternatively, a film made of other heat-resistant resins, a glass epoxy substrate, or the like may be used.

Copper (Cu) is normally used as the material of conductor patterns. Nonetheless, other conductive metals, such as silver, a copper alloy, stainless steel, aluminum, or the like can be used.

<Preparation of Double-Sided Plate>

In the method of the present aspect, a step of providing a double-sided plate that is an insulating substrate having conductive layers on the respective surfaces thereof is performed first.

In the case of making a printed circuit board by use of a subtractive method, a copper (Cu) foil or the like is used as a conductive layer. For example, a double-sided substrate in which copper foils are laminated on the respective opposite surfaces of an insulating substrate may be prepared. The conductive layers may be formed by bonding metal foils, such as copper foils, to the respective surfaces of the substrate, or by performing electroplating upon forming thin conductive layers, for example.

In the case of making a printed circuit board for which interconnects are formed by a semi-additive method, the conductive layers serve as a conductive layer (i.e., seed layer) for feeding electroplating power to form interconnects. In this case, a double-sided plate is prepared by forming thin copper layers through electroless plating on both surfaces of the insulating substrate. In place of electroless plating, sputtering may be used to form conductive layers (seed layers) on both surfaces of the insulating substrate.

After the preparation of the double-sided plate, the steps of coating with photosensitive resin films, exposing an interconnect pattern to light, and a development process are performed with respect to the conductive layers on the respective surfaces of the insulating substrate.

<Coating with Photosensitive Resin Film>

Photosensitive resin films are laminated onto the conductive layers on the respective surfaces of the double-sided plate prepared as described above, thereby coating the conductive layers.

The photosensitive resin film used in the present aspect includes a photosensitive resin layer made of a photosensitive resin and a support layer laminated to one surface thereof to support and protect the photosensitive resin layer. A protective layer may be provided on the opposite surface of the photosensitive resin layer. In this case, the protective layer is detached before use. The photosensitive resin layer is laminated onto the conductive layer in such a manner that the photosensitive resin layer is in contact with the conductive layer, so that the insulating substrate, the conductive layer, the photosensitive resin layer, and the support layer are stacked one over another in this order.

Many of the commercially available photosensitive resin films have a support layer on one surface of the photosensitive resin layer and a protective layer on the other surface thereof. For example, a photosensitive resin film sold by Nikko-Materials Co. Ltd. as a dry-film photoresist has films laminated on both surfaces of a resist layer. When a photosensitive resin film of this type is used in the present aspect, a protective layer on one surface is detached to expose the photosensitive resin layer during use.

<Photosensitive Resin Film>

In the following, elements constituting the photosensitive resin film used in the present aspect will be described.

As a material for forming a photosensitive resin layer (i.e., resist layer), an ultraviolet (UV) curable resin or the like known in the art may be used. Specifically, an acrylic system or the like may be used. The thickness of the photosensitive resin layer is not limited to a particular thickness, but may generally be in the range of approximately 5 to 100 µm.

The support layer is made of a material that is capable for forming a film protecting the photosensitive resin layer, and is detachable from the photosensitive resin layer. In the case of UV irradiation being used for exposure, it is preferable for this material to have a high UV transmittance and the capacity to form a flat film (i.e., have a flattening property). PET, polypropylene, polyolefin, or the like may thus be used as this material. In particular, a resin having PET as the main material is preferably used from the viewpoint of UV transmittance and flattening property Here, the phrase "having as the main material" means not only the case of having PET alone but also the case of having PET as the largest component with the presence of other components that are contained to the extent to which the purpose of the invention is not undermined.

The thickness of the support layer is not particularly limited as long as the thickness is sufficient to protect the photosensitive resin layer, but may preferably be 5 to 200 µm under normal circumstances, and may more preferably be 10 to 30 µm from the viewpoint of UV transmittance and ease of handling. Further, the peel force of the support layer with respect to the photosensitive resin layer is preferably 0.2 to 20 N/m.

The photosensitive resin film used in the present aspect may be manufactured, for example, by a method that involves making a support layer made of PET or the like, coating one surface thereof with a photosensitive resin solution in a predetermined thickness, and drying to form a photosensitive resin layer.

<Exposure>

After coating with the photosensitive resin film, an interconnect pattern is exposed to light.

In the case of the photosensitive resin film being a negative type, an example of the exposure method includes a method that involves placing a mask having a tracing of an interconnect pattern on the surface of the support layer of the photosensitive resin film, shining UV on the mask, and illuminating only the portion of the interconnect pattern with UV for curing. In this case, after exposure, the support layer is detached, and what is left is immersed in a developer to remove uncured portions, which leaves only the cured portions that forms the interconnect pattern made of the photosensitive resin layer. It may also be conceivable to use other high-energy electromagnetic waves or particle beams such as electron beams in place of UV.

In the case of the photosensitive resin film being a positive type, i.e., in the case of using a photosensitive resin film having a photosensitive resin layer made of a photosensitive resin whose portions exposed to light become soluble in a developer liquid, a method may involve irradiating portions other than the interconnect pattern to make these portions soluble in the developer liquid.

Examples of exposure methods include a projection exposure method that involves placing a lens between a mask and the substrate and forming the image of a mask pattern on the photosensitive resin on the substrate for exposure, a direct exposure method that utilizes a laser beam without using a mask, a contact exposure method that performs exposure by placing a mask in contact with the substrate, and a proximity exposure method that performs exposure by providing a clearance of several micrometers to several tens of micrometers between a mask and the substrate. Any one of these methods is usable. In particular, a fine pitch circuit may be formed by using a projection exposure method that involves placing a lens between a mask and the substrate and forming the image of a mask pattern on the photosensitive resin on the substrate for exposure, or by using a direct exposure method that utilizes a laser beam without using a mask.

<Detachment of Support Layer and Development>

After exposure of the interconnect pattern, the support layer is detached, and, then, development is performed. Upon development, the portions of the photosensitive resin layer other than those constituting the interconnect pattern is dissolved and removed by the developer, which leaves only the portions corresponding to the interconnect pattern, thereby forming the interconnect pattern made of the photosensitive resin layer. Development may be performed by immersing the laminated structure after exposure in a developer, which dissolves the uncured portions of the photosensitive resin layer or the portions of the photosensitive resin layer which has become soluble by irradiation. As the developer, an alkaline solution such as an aqueous sodium carbonate solution ($Na_2CO_3/H_2O$) may be used when the photosensitive resin layer is made of an alkali-soluble resin.

<Process after Development—for Subtractive Method>

In the case of manufacturing a printed circuit board by use of a subtractive method, the conductive layer is etched after development. The conductive layer is exposed in the areas where the photosensitive resin layer is removed by development. Etching removes the conductive layer in these exposed areas, leaving the conductive layer coated with the photosensitive resin layer only in the areas of the interconnect pattern. Etching of the conductive layer may be performed by chemical etching, for example, using an etchant such as an aqueous iron chloride solution, an aqueous copper chloride solution, or the like.

After etching, the photosensitive resin layer is detached from the conductive layer by a treatment using a release solution. The detachment process removes the photosensitive resin layer covering the conductive layer so as to make the conductor pattern. An aqueous sodium hydroxide solution may be used as the release solution, for example.

<Process after Development—for Semi-Additive Method>

In the case of manufacturing a printed circuit board by use of a semi-additive method, electric power is supplied to the conductive layer (i.e., the seed layer: a thin copper layer or the like formed by electroless plating) after development, thereby performing electroplating with a material for making interconnects such as copper (i.e., electrolytic copper plating), for example. Electroplating causes the material for making interconnects to be plated and laminated on the areas where the photosensitive resin layer is removed by development, that is, on the areas where the conductive layer is exposed, thereby forming interconnects. Subsequently, the photosensitive resin layer is removed by detachment from the conductive layer in the same manner as in the subtractive method. The conductive layer is exposed by removing the photosensitive resin layer. Such an exposed conductive layer is removed by etching (quick etching), thereby forming the conductor pattern.

(2) Second Aspect and Third Aspect

The second aspect of the present disclosures is:

a method of making a printed circuit board having conductor patterns on both surfaces of an insulating substrate, including:

a step of providing a double-sided plate including the insulating substrate, a conductive layer A1 laminated on one surface thereof, and a conductive layer B1 laminated on another surface of the insulating substrate;

a first coating step of coating a surface of the conductive layer A1 with a photosensitive resin film C1 having a photosensitive resin layer and a support layer covering one surface thereof such that the photosensitive resin layer is in contact with the conductive layer A1;

a second coating step of coating a surface of the conductive layer B1 with a laminated structure including a photosensitive resin film D1 and a cover layer, the photosensitive resin film D1 including a photosensitive resin layer and a support layer covering one surface thereof, the cover layer covering a surface of the support layer, such that the photosensitive resin layer is in contact with the conductive layer B1;

a first exposure step of exposing the photosensitive resin film C1 after the second coating step;

a cover layer detachment step of detaching the cover layer after the first exposure step; and a second exposure step of exposing the photosensitive resin film D1 after the cover layer detachment step.

The third aspect of the present disclosures is: a method of making a printed circuit board having conductor patterns on both surfaces of an insulating substrate, including:

a step of providing a double-sided plate including the insulating substrate, a conductive layer A1 laminated on one surface thereof, and a conductive layer B1 laminated on another surface of the insulating substrate;

a first coating step of coating a surface of the conductive layer A1 with a photosensitive resin film C1 having a photosensitive resin layer and a support layer covering one surface thereof such that the photosensitive resin layer is in contact with the conductive layer A1;

a second coating step of coating a surface of the conductive layer B1 with a photosensitive resin film D1 having a photosensitive resin layer and a support layer covering one surface thereof such that the photosensitive resin layer is in contact with the conductive layer B1;

a third coating step of coating a surface of the support layer constituting the photosensitive resin film D1 with a cover layer after the second coating step;

a first exposure step of exposing the photosensitive resin film C1 after the third coating step;

a cover layer detachment step of detaching the cover layer after the first exposure step; and a second exposure step of exposing the photosensitive resin film D1 after the cover layer detachment step.

A method of making a printed circuit board according to the second aspect and the third aspect is the same as the method of making a printed circuit board according to the first aspect in the sense that the following steps are provided:

for each of the conductive layers on both surfaces after preparation of a laminated structure including the insulating substrate and the conductive layers laminated on both surfaces thereof, a step of coating the surface of the conductive layer with the photosensitive resin film; and a step of performing exposure with respect to the interconnect pattern of the photosensitive resin film. The noted method is the same as the method of making a printed circuit board according to the first aspect also in the sense that the photosensitive resin film is developed to form the conductor pattern after the support layer of the photosensitive resin film is detached.

The method of making a printed circuit board according to the second aspect is characterized in the following:

the surface of the conductive layer (i.e., the conductive layer B1) on one surface is covered with a laminated structure that includes the photosensitive resin film D1 constituted by the photosensitive resin layer and the support layer covering one surface thereof and that also includes the cover layer covering the surface of the support layer; and after exposure (i.e., the first exposure step) for an interconnect pattern is performed with respect to the other surface (on the conductive layer A1 side), the cover layer is removed by detachment, and, then, exposure (i.e., the second exposure step) for an interconnect pattern is performed with respect to the surface on the conductive layer B1 side.

The method of making a printed circuit board according to the third aspect is characterized in the following: the third coating step is provided that covers the surface of the support layer of the photosensitive resin film D1 with the cover layer before exposing (in the first exposure step) the interconnect pattern to light on the conductive layer A1 side; and after the first exposure step, the cover layer is removed by detachment, and, then, exposure (the second exposure step) for an interconnect pattern is performed with respect to the surface on the conductive layer B1 side.

A photosensitive resin film with the surface of the support layer being exposed may be used in the manufacturing of a printed circuit board having interconnects on both surfaces of an insulating substrate. As one of the surfaces of a double-sided plate which includes the insulating substrate and conductive layers laminated on both surfaces thereof is exposed, irregularities with depressions having a maximum depth of 1.0 µm or more are generated on the surface of the support layer which is opposite the surface subjected to exposure, due to contact with equipment such as a roller for carrying the double-sided plate. This results in the occurrence of a failure such as an interconnect break in the case of a subtractive method and a short defect in the case of a semi-additive method. According to the second aspect and the third aspect, however, the cover layer comes in contact with the equipment such as a roller, and the surface of the support layer does not come into direct contact with the roller or the like. Even if the surface of the cover layer is damaged by a transport-purpose roller or the like, the surface of the support layer remains intact, without experiencing the occurrence of such a depression as having a maximum depth of 1.0 µm or more. Accordingly, once the cover layer is removed by detachment before exposure, the laminated support layer having no scratches thereon is available for exposure, so that a failure such as an interconnect break or a short defect does not occur.

In the following, the configuration of production methods according to the second aspect and the third aspect will be described.

A printed circuit board having interconnects on both surfaces of an insulating substrate fabricated according to the second aspect and the third aspect is the same printed circuit board as in the first aspect.

Steps may be performed for the second aspect in the same manner as the steps of the first aspect, except for the following: the laminated structure covering the surface of the conductive layer B1 includes the photosensitive resin film D1 constituted by a photosensitive resin layer and a support layer covering one surface thereof, and includes a cover layer covering the surface of the support layer; and a cover layer detachment step is provided that detaches the cover layer after the first exposure step.

Steps may be performed for the third aspect in the same manner as the steps of the first aspect, except that prior to the first exposure step for the conductive layer A1 side, the cover layer is provided to cover the surface of the support layer of the photosensitive resin film D1 laminated on the conductive layer B1, and except that the cover layer detachment step is provided to detach the cover layer after the first exposure step.

Namely, in the first aspect and the second aspect, the photosensitive resin films C1 and D1 that may be the same as the photosensitive resin film used in the first aspect may be used, the step of providing the double-sided plate having an insulating substrate, a conductive layer A1 laminated to one surface thereof, and a conductive layer B1 laminated to the other surface of the insulating substrate may be performed in the same manner as the preparation of the laminated structure performed in the first aspect, the first coating step and the second coating step may be performed in the same manner as the steps of coating in the first aspect, which use the photosensitive resin film for coating such that the photosensitive resin layer is in contact with the conductive layer, and the first exposure step and the second exposure step may be performed in the same manner as the steps of exposing the interconnect patterns in the first aspect.

The steps performed after the exposure step, that is, separating the support layer, developing and forming the interconnect pattern, forming the interconnects by use of a subtractive method or a semi-additive method, may also be performed in the same manner as in the first aspect.

<Cover Layer>

The cover layer used in the second aspect and third aspect of the present disclosures and the cover layer constituting the laminated structure of the fourth aspect are made of a material capable of forming a coating and detachable from the support layer. Since the cover layer detachment step is performed prior to the detachment of the support layer of the photosensitive resin film, the cover layer needs to be detached from the support layer with a less force than the force required to detach the support layer from the photosensitive resin. However, detachment prior to the cover layer detachment process needs to be prevented. Therefore, it is preferable for the material to have a thermal expansion coefficient close to that of the support layer, and a film made of the same material as the support layer is preferably used.

It is desirable that the cover layer have a sufficient thickness to prevent scratches from occurring on the support layer at the time of coming in contact with a roller or the like during the manufacturing process.

(3) Fourth Aspect

A fourth aspect of the present disclosures is directed to a laminated structure used in a method of making a printed circuit board, which includes a photosensitive resin layer, a support layer covering one surface of the photosensitive resin layer, and a cover layer covering the surface of the support layer. This laminated structure is used in a method for making a printed circuit board of the second aspect. Since the second aspect is characterized in the use of this laminated structure of the fourth aspect (and also the step of detaching the cover layer), the use of this laminated structure of the fourth aspect serves to provide the effect of the second aspect.

In the following, examples of the embodiments of the present disclosures will be described in more detail with reference to the drawings. FIG. 1 through FIG. 5 are schematic drawings provided for illustration purposes, and are not intended to represent the ratios of layer thicknesses and the like.

Figure 2A:
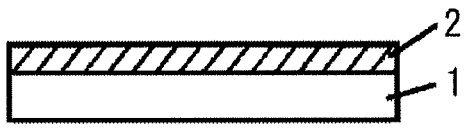
FIG. 2A is a cross-sectional view schematically illustrating an example of a photosensitive resin film used in a method of making a printed circuit board of the present disclosures.

FIG. 1 is a cross-sectional view schematically illustrating an example configuration of a laminated structure according to the fourth aspect, i.e., the one used in the second coating step of the second aspect. The laminated structure includes a photosensitive resin film D1 including a photosensitive resin layer 1 and a support layer 2, and further includes a cover layer 3. FIG. 2A is a cross-sectional view schematically illustrating the configuration of the photosensitive resin films C1 and D1 used in the second aspect and the third aspect.

The photosensitive resin film illustrated in FIG. 2A includes the photosensitive resin layer 1 and the support layer 2 which is detachably laminated on one surface of the photosensitive resin layer 1 to support and protect the photosensitive resin layer 1. The laminated structure illustrated in FIG. 1, i.e., the laminated structure of the fourth aspect or the laminated structure used in the second coating step of the second aspect, is further provided with the cover layer 3 that is detachably laminated on one surface of the support layer 2.

Figure 2B:
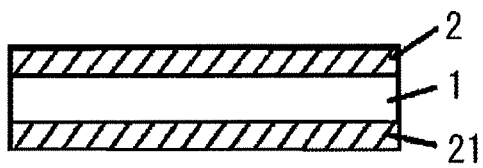
FIG. 2B is a cross-sectional view schematically illustrating an example of a commercially available photosensitive resin film used in a method of making a printed circuit board of the present disclosures.

FIG. 2B is a cross-sectional view schematically illustrating an example of a commercially available photosensitive resin film.

As illustrated in FIG. 2B, a commercially available photosensitive resin film typically has a photosensitive resin layer 1, and further has a support layer 2 and a protective layer 21 that are detachably laminated on the respective opposite surfaces of the photosensitive resin layer 1 to support and protect the photosensitive resin layer 1. The protective layer 21, which has a smooth surface facing the photosensitive resin, is made of polyethylene or the like, which is flexible.

The photosensitive resin film illustrated in FIG. 2A may be obtained by detaching the protective layer 21 on one surface of the commercially available photosensitive resin film as illustrated in FIG. 2B.

For the laminated structure illustrated in FIG. 1, an employed method may involve laminating the cover layer 3 on the support layer 2 on one surface of the photosensitive resin film as illustrated in FIG. 2B and detaching the protective layer 21. Alternatively, an employed method may involve applying a photosensitive resin to a pre-laminated structure comprised of the support layer 2 and the cover layer 3 and laminating the protective layer 21 on the other surface thereof, followed by detaching the protective layer 21 at the time of attachment to a substrate. Alternatively, an employed method may involve detaching the protective layer 21 on one surface of the photosensitive resin film as illustrated in FIG. 2B and laminating the cover layer 3 on the support layer 2 on the other surface thereof.

Figure 3A:
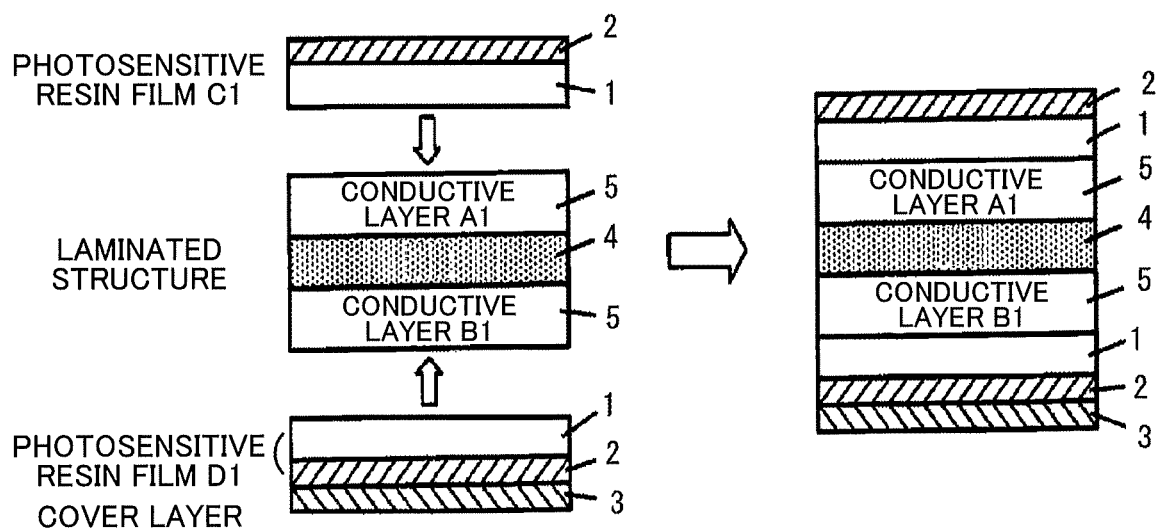
FIG. 3A is a drawing schematically illustrating the procedure of a coating process in a method of making a printed circuit board according to one embodiment of the second aspect.

FIG. 3A is a cross-sectional view schematically illustrating the first coating step and the second coating step of the method of making a printed circuit board according to the second aspect.

The laminated structure illustrated in the figure is such that the conductive layers 5 (i.e., the conductive layer A1 and the conductive layer B1) are laminated on the respective opposite surfaces of the insulating substrate 4.

As illustrated in FIG. 3A, the conductive layer A1 is coated with the photosensitive resin film C1 including the photosensitive resin layer 1 and the support layer 2 such that the photosensitive resin layer 1 is in contact with the conductive layer A1. The conductive layer B1 is coated with the laminated structure comprised of the cover layer 3 and the photosensitive resin film D1 which includes the photosensitive resin layer 1 and the support layer 2, such that the photosensitive resin layer 1 is in contact with the conductive layer B1. This produces the laminated structure illustrated on right-hand side of FIG. 3A.

Figure 3B:
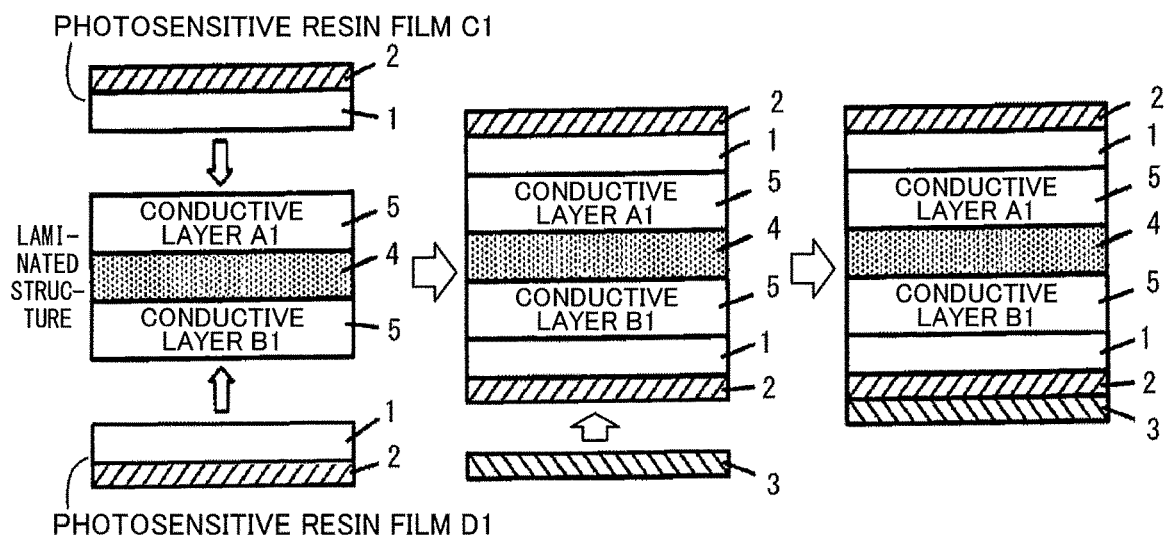
FIG. 3B is a drawing schematically illustrating the procedure of a coating process in a method of making a printed circuit board according to one embodiment of the third aspect.

FIG. 3B is a cross-sectional view schematically illustrating the first coating step, the second coating step, and the third coating step of the method of making a printed circuit board according to the third aspect. The laminated structure illustrated in the figure is such that the conductive layers 5 (i.e., the conductive layer A1 and the conductive layer B1) are laminated on the respective opposite surfaces of the insulating substrate 4. As illustrated in the drawing, the conductive layers A1 and B1 are coated with the photosensitive resin films C1 and D1, respectively, each including the photosensitive resin layer 1 and the support layer 2, such that the photosensitive resin layers 1 are in contact with the conductive layers A1 and B1. This produces the laminated structure as illustrated in the middle of FIG. 3B. Subsequently, as illustrated in FIG. 3B, the support layer 2 (i.e., the support layer of the photosensitive resin film D1) on one surface of the constructed laminated structure is coated with the cover layer 3 (third coating process). This produces the laminated structure illustrated on the right-hand side of FIG. 3B (which is the same as the laminated structure illustrated on the right-hand side of FIG. 3A).

Figure 4:
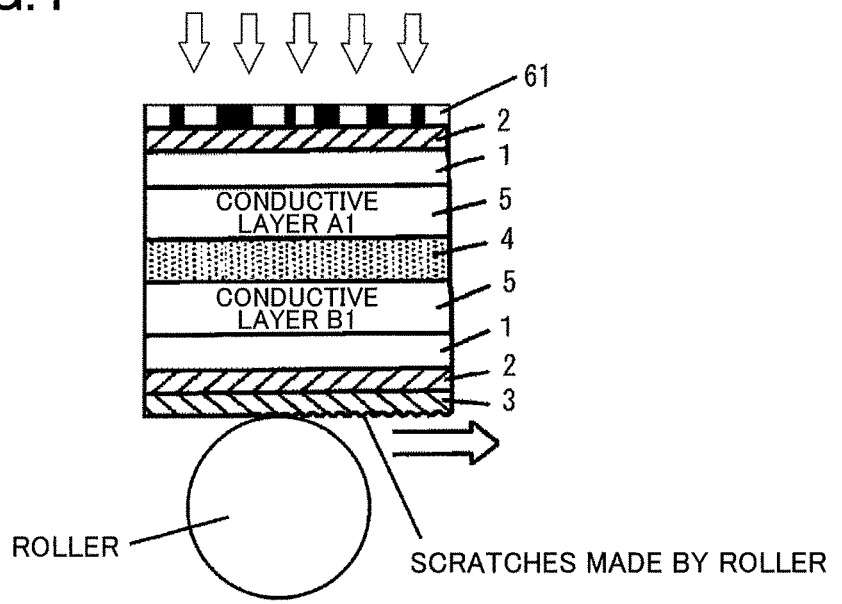
FIG. 4 is a drawing schematically illustrating the procedure of a first exposure step in a method of making a printed circuit board according to one embodiment of the second aspect and the third aspect.

FIG. 4 is a cross-sectional view schematically illustrating exposure that is performed in the first exposure step of the second aspect and the third aspect. As illustrated in FIG. 4, a mask 61 having a tracing of an interconnect pattern is placed on the surface of the support layer 2 (i.e., the support layer of the photosensitive resin film C1) on one surface of the laminated structure illustrated on the right-hand side of FIG. 3A or FIG. 3B, and exposure is performed by shining UV or the like from above the mask 61 (as shown by the downward arrows in FIG. 4). During this process, the surface of the cover layer 3 on the other surface of the laminated structure is damaged due to contact with a roller used for conveying the laminated structure (as shown by the undulating line in FIG. 4: scratches caused by the roller). However, since the support layer 2 (i.e., the support layer of the photosensitive resin film D1) is protected by the cover layer 3 and does not come into contact with the roller, the surface thereof is not damaged.

Figure 5:
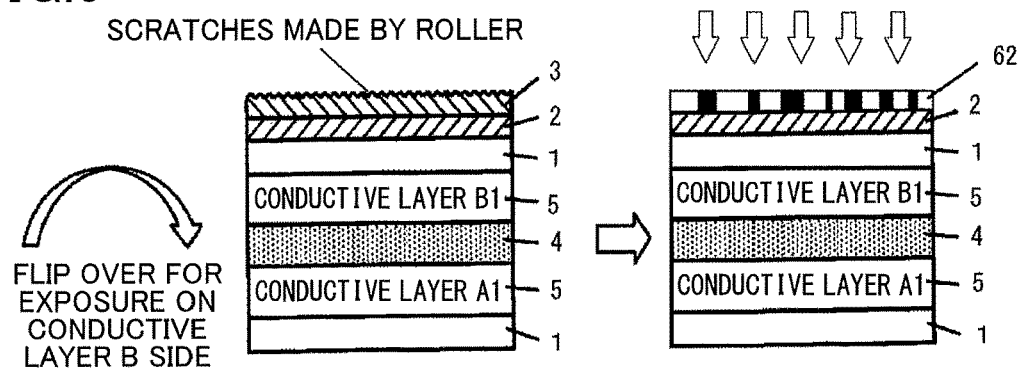
FIG. 5 is a drawing schematically illustrating the procedure of a second exposure step in a method of making a printed circuit board according to one embodiment of the second aspect and the third aspect.

FIG. 5 is a cross-sectional view schematically illustrating exposure that is performed in the second exposure step of the second aspect and the third aspect.

As illustrated on the left-hand side of FIG. 5, there are scratches on the surface of the cover layer 3 as a result of contact with a roller. This cover layer 3 is detached to expose the intact surface of the support layer 2. The surface is then covered with a mask 62 having a tracing of an interconnect pattern, and is exposed to light (as shown by the downward arrows in FIG. 5). As a result, the occurrence of a defect such as a line-like scratch in the photosensitive resin layer 1 on the conductive layer B is reduced upon development, which reduces the occurrence of a break or a short failure in the conductor pattern.

[Embodiments]

First Comparative Example

A sputter substrate was prepared that had a 40-nm thick NiCr layer and a 0.4-μm thick Cu layer (i.e., conductive layer: seed layer) on a surface of a 25-μm thick polyimide substrate (i.e., insulating substrate). A negative dry film resist (i.e., a photosensitive resin film) including a 19-μm thick photosensitive resist layer and a support layer with depressions having a maximum depth of 1.2 μm in the support layer was laminated on the surface of the sputter substrate, such that the photosensitive resin layer is in contact with the Cu layer.

A mask having a tracing of an interconnect pattern in L/S=10/10 μm was placed on the surface of the dry film resist, and pattern exposure was performed by a projection exposure apparatus.

After exposure, the support layer was detached, and development was performed to form a dry-film resist pattern. Thereafter, electrolytic copper plating, detaching of the dry film resist, and detachment of the Cu layer and the NiCr layer exposed by the detaching were conducted in sequence. In the course of the above-described processes, an unexposed portion was generated in the photosensitive resin at the position corresponding to a depression in the support layer, and the photosensitive resin of the unexposed portion was dissolved in the developing process. This portion was plated in electrolytic copper plating, resulting in the occurrence of a short defect.

Second Comparative Example

A 60-μm thick glass epoxy substrate (i.e., insulating substrate) with a 12-μm thick Cu layer (i.e., conductive layer) on the surface thereof was prepared. A negative dry film resist (i.e., a photosensitive resin film) including a 15-μm thick photosensitive resist layer and a support layer with depressions having a maximum depth of 1.8 μm in the support layer was laminated on the surface of the glass epoxy substrate, such that the photosensitive resin layer is in contact with the Cu layer.

A mask having a tracing of an interconnect pattern in L/S=30/30 μm was placed on the surface of the dry film resist, and pattern exposure was performed by a projection exposure apparatus.

After exposure, the support layer was detached, and development was performed to form a dry-film resist pattern, followed by etching.

In the course of the above-described processes, an unexposed portion was generated in the photosensitive resin at the position corresponding to a depression in the support layer, and the unexposed photosensitive resin was dissolved in the developing process. Copper at this portion was removed at the time of etching, resulting in the occurrence of an interconnect break.

First Example

Exposure, development, electrolytic copper plating, detaching of the Cu layer and NiCr layer were performed in the same manner as in the first comparative example, except that a negative dry film resist with depressions having a maximum depth of 0.6 μm in the support layer was used as the photosensitive resin film.

After the above-described steps, an unexposed portion was not generated in the photosensitive resin even at the positions corresponding to depressions in the support layer, and no short defects occurred.

Second Example

Exposure, development, and etching were performed in the same manner as in the second comparative example, except that a negative dry film resist with depressions having a maximum depth of 0.8 μm in the support layer was used as the photosensitive resin film.

After the above-described steps, an unexposed portion was not generated in the photosensitive resin even at the positions corresponding to depressions in the support layer, and no interconnect break occurred.

The results of the above-described comparative examples and the above-described examples show that the use of a photosensitive resin film with depressions having a maximum depth of 1.0 μm or more in the support layer entails the occurrence of a short defect or an interconnect break, but the use of one with a maximum depth of less than 1.0 μm results in a reduced likelihood of a short defect and an interconnect break.

DESCRIPTION OF REFERENCE SYMBOLS

1 photosensitive resin layer
2 support layer
21 protective layer
3 cover layer
4 insulating layer
5 conductive layer
61, 62 mask

What is claimed is:

1. A laminated structure for use in a method of making a printed circuit board, the laminated structure comprising:
    a photosensitive resin layer;
    a support layer covering one surface of the photosensitive resin layer, the support layer configured to transmit light for curing the photosensitive resin layer, the support layer having a light incident surface through which the light enters, and having a light exit surface that is in contact with the one surface of the photosensitive resin layer; and
    a cover layer covering the light incident surface of the support layer and configured to be removed before the curing of the photosensitive resin layer,
    wherein the support layer and the cover layer are configured such that a maximum depth of a depression in the light incident surface of the support layer is less than 1 μm,
    wherein the photosensitive resin layer, the support layer, and the cover layer are arranged one over another in the following order: the photosensitive resin layer, the support layer, and the cover layer, and
    wherein the support layer comprises at least one of PET, polypropylene, and polyolefin.

2. The laminated structure as claimed in claim 1, wherein the cover layer comprises at least one of PET, polypropylene, and polyolefin.

3. The laminated structure as claimed in claim 1, wherein the support layer comprises PET, and the cover layer comprises PET.

* * * * *